US012699131B2

(12) United States Patent　　　　　(10) Patent No.:　　US 12,699,131 B2

Mehra et al.　　　　　　　　　　　　　(45) Date of Patent:　　　　Aug. 4, 2026

(54) FLEXIBLE TEST INSTRUCTION SET ARCHITECTURE

(71) Applicant: Signature IP Corporation, Milpitas, CA (US)

(72) Inventors: Shivam Mehra, New Delhi (IN); Parag Bhatt, San Jose, CA (US); Michael Loe Fernandez, Quezon City (PH); Kishore Mishra, Santa Clara, CA (US); Purna Mohanty, Sunnyvale, CA (US)

(73) Assignee: Signature IP Corporation, Milpitas, CA (US)

( * ) Notice: Subject to any disclaimer, the term of this patent is extended or adjusted under 35 U.S.C. 154(b) by 0 days.

(21) Appl. No.: 18/906,206

(22) Filed: Oct. 4, 2024

(65) Prior Publication Data

US 2025/0116701 A1　　　Apr. 10, 2025

Related U.S. Application Data

(60) Provisional application No. 63/688,925, filed on Aug. 30, 2024, provisional application No. 63/663,205, filed on Jun. 24, 2024, provisional application No. 63/643,941, filed on May 8, 2024, provisional application No. 63/551,091, filed on Feb. 8, 2024, provisional application No. 63/617,823, filed on Jan. 5, 2024, provisional application No. 63/615,862, filed on Dec. 29, 2023, provisional application No. 63/601,497, filed on Nov. 21, 2023, provisional application No. 63/542,800, filed on Oct. 6, 2023.

(51) Int. Cl.
　　*G01R 31/28*　　　(2006.01)
　　*G01R 31/317*　　(2006.01)

(52) U.S. Cl.
　　CPC . *G01R 31/31707* (2013.01); *G01R 31/31712* (2013.01)

(58) Field of Classification Search
　　None
　　See application file for complete search history.

(56) References Cited

U.S. PATENT DOCUMENTS

| | | | |
|---|---|---|---|
| 6,892,328 B2 | 5/2005 | Klein et al. | |
| 8,533,545 B2 | 9/2013 | Goyal et al. | |
| 8,621,301 B2 | 12/2013 | Goyal et al. | |
| 9,436,491 B1 | 9/2016 | Chiou | |

(Continued)

*Primary Examiner* — Mujtaba M Chaudry

(74) *Attorney, Agent, or Firm* — Adams Intellex, PLC

(57) ABSTRACT

Techniques for the testing of devices are disclosed. A testing environment is accessed. The testing environment includes an instruction RAM, an instruction fetch and decode unit (FAD), a code exerciser, a command interface, and a trace RAM. A device under test (DUT) is accessible by the command interface. The testing environment includes a test instruction set architecture (TISA). A test sequence is programmed by a user. The test sequence includes one or more instructions from within the TISA. The test sequence is stored in the instruction RAM. A first instruction is fetched by the FAD. The fetching includes decoding the first instruction. The first instruction is translated by the code exerciser. The translating produces a first packetized communication, which is sent to the DUT. A first packetized response is received by the command interface from the DUT and is reported to the user.

27 Claims, 6 Drawing Sheets

(56) References Cited

U.S. PATENT DOCUMENTS

| | | | | |
|---|---|---|---|---|
| 9,836,384 | B2 | 12/2017 | Leinfellner et al. | |
| 10,078,579 | B1 * | 9/2018 | Joshi | G06F 11/3672 |
| 10,114,658 | B2 | 10/2018 | Huang et al. | |
| 10,133,767 | B1 * | 11/2018 | Cole | G06F 16/2329 |
| 10,198,346 | B1 * | 2/2019 | Cole | G06F 11/3698 |
| 10,250,721 | B2 | 4/2019 | Massa et al. | |
| 10,282,315 | B2 | 5/2019 | Siva et al. | |
| 10,331,657 | B1 * | 6/2019 | Cole | G06F 16/901 |
| 10,348,563 | B2 | 7/2019 | Rao et al. | |
| 10,547,514 | B2 | 1/2020 | Rao et al. | |
| 10,740,523 | B1 | 8/2020 | Klein | |
| 10,911,323 | B2 | 2/2021 | Hiers et al. | |
| 11,010,322 | B1 | 5/2021 | Morshed | |
| 11,657,203 | B2 | 5/2023 | Cherif et al. | |
| 2019/0087513 | A1 * | 3/2019 | Mukherjee | G06F 30/3323 |
| 2020/0210182 | A1 * | 7/2020 | Hughes | G06F 9/30076 |
| 2020/0356538 | A1 * | 11/2020 | Liu | G06F 16/196 |
| 2021/0303449 | A1 * | 9/2021 | Hershkovitz | G06F 11/3698 |
| 2022/0018901 | A1 | 1/2022 | Jones et al. | |
| 2022/0210030 | A1 | 6/2022 | Cherif et al. | |
| 2023/0015543 | A1 | 1/2023 | Chen et al. | |
| 2023/0058989 | A1 * | 2/2023 | Hammarlund | G06F 12/0831 |
| 2023/0105677 | A1 | 4/2023 | de Lescure et al. | |
| 2023/0401130 | A1 * | 12/2023 | Mehta | G06F 11/0721 |
| 2023/0401132 | A1 * | 12/2023 | Patle | G06F 11/261 |
| 2024/0143330 | A1 * | 5/2024 | Houston | G06F 1/3296 |

* cited by examiner

400

OPCODES 423

451
452
453

0x00 OPC_RESET_STS
0x0C OPC_WRITE CONFIG DATA_TO_DUT
0x03 OPC_STS_ARM
0x07 OPC_STS_COMPL_PROGRAM
0x0C OPC_READ_DATA_FROM_STS
0x10 OPC_STS_CLEANUP

TISA 410

HOST 420

TEST PROGRAM 430

INSTRUCTION RAM 440

FETCH AND DECODE 450

CODE EXERCISER 460

COMPLIANCE PROGRAM TEST 462

COMMAND INTERFACE 470

PACKETS 472

DUT 480

TRACE RAM 490

FLEXIBLE TEST INSTRUCTION SET ARCHITECTURE

RELATED APPLICATIONS

This application claims the benefit of U.S. provisional patent applications "Flexible Test Instruction Set Architecture" Ser. No. 63/542,800, filed Oct. 6, 2023, "Functional Safety BIST With System Vitals" Ser. No. 63/601,497, filed Nov. 21, 2023, "Trace-Based Testing With Software Access Points" Ser. No. 63/615,862, filed Dec. 29, 2023, "Round Robin Bus Arbitration With Control Vectors and Increment And Decrement Functions", Ser. No. 63/617,823, filed Jan. 5, 2024, "Weighted Round Robin Bus Arbitration With Control Vectors And Increment And Decrement Functions" Ser. No. 63/551,091, filed Feb. 8, 2024, "Coupling Network-On-Chip Sub-Topologies With Derivative Clocks" Ser. No. 63/643,941, filed May 8, 2024, "Cloud-Native Network-On-Chip Validation With Sub-Topologies" Ser. No. 63/663,205, filed Jun. 24, 2024, and "Cloud-Native Network-On-Chip Validation Including Sub-Topologies, Ser. No. 63/688,925, filed Aug. 30, 2024.

Each of the foregoing applications is hereby incorporated by reference in its entirety.

FIELD OF ART

This application relates generally to electronics and more particularly to a flexible test instruction set architecture.

BACKGROUND

Quality is an important aspect of any product, as it directly impacts customer satisfaction, brand reputation, and overall business success. Quality can be defined as the degree to which a product or service meets or exceeds customer expectations. Ensuring high quality involves various processes, and testing plays a pivotal role in maintaining and enhancing the quality of products. If a business ships products with high numbers of defects, this can have significant and wide-ranging deleterious business impacts. These impacts can affect a company's reputation, customer satisfaction, financial health, and long-term viability. Customers who receive defective products are likely to have a negative perception of the company. This can harm the company's reputation and erode trust in its brand. Additionally, dissatisfied customers may take their business elsewhere, leading to a loss of customer loyalty. Retaining loyal customers is often more cost effective than acquiring new ones. Moreover, in cases where defects pose safety risks, companies may need to issue product recalls. Such recalls can be expensive and damaging to the brand's image. Additionally, legal liabilities may arise if defective products cause harm to customers.

High-quality products lead to satisfied customers. When products meet or exceed customer expectations, it fosters loyalty and positive word-of-mouth, which can attract new customers and retain existing ones. Consistently delivering high-quality products enhances a brand's reputation. Positive reviews, recommendations, and a strong brand image are all built upon a foundation of quality. Furthermore, catching and rectifying defects early in the development process are far less expensive than addressing them after the product is released. Effective testing helps identify issues before they reach customers, and reduces the costs associated with recalls, repairs, and customer support. Moreover, high-quality products give a competitive edge in the market.

When customers have a choice between products, they are more likely to choose the one known for its quality and reliability.

Testing is a major component for achieving high quality products. Quality assurance (QA) and quality control (QC) stages of product development serve to catch issues before products are deployed to end users. The QA/QC process involves systematically evaluating a product's functionality, performance, and usability to identify defects, inconsistencies, and areas for improvement. Testing helps identify defects, bugs, and inconsistencies in the product's design and functionality. Early detection allows quality assurance teams to address these issues before the product reaches customers. Additionally, testing validates that the product meets its intended requirements and verifies that it functions as expected. Testing can be used to confirm that the product aligns with user needs and business goals. Moreover, testing assesses how well the product performs under various conditions, such as load, stress, and scalability. This helps ensure that the product can handle real-world usage.

Thus, quality is a fundamental aspect of products and services and directly impacts customer satisfaction, brand reputation, and business success. High-quality products give a competitive edge in the market. When customers have a choice between products, they are more likely to choose the one known for its quality and reliability. Testing plays a pivotal role in maintaining and enhancing product quality by identifying defects, validating functionality, evaluating performance, and ensuring compliance. Testing is an integral part of the development process that contributes to creating products that meet and exceed customer expectations.

SUMMARY

With the large number of devices and types of tests, it is beneficial to make the testing process as efficient as possible, while still maintaining effective test coverage. Disclosed techniques help to achieve this goal by providing a testing environment that utilizes a test instruction set architecture (TISA). The TISA provides flexibility that allows a range of functions, from execution of a single low-level instruction, to using an opcode to run a sequence of tests. The sequence can even include full compliance tests that may include 10, 20, 40, or more tests to evaluate the compliance of a PCIe and/or CXL device. These tests can comprise a compliance verification test suite. If the device-under-test (DUT) passes the compliance test, stakeholders can feel confident about the compliance of the DUT.

Techniques for the testing of devices are disclosed. A testing environment is accessed. The testing environment includes an instruction RAM, an instruction fetch and decode unit (FAD), a code exerciser, a command interface, and a trace RAM. A device under test (DUT) is accessible by the command interface. The testing environment includes a test instruction set architecture (TISA). A test sequence is programmed by a user. The test sequence includes one or more instructions from within the TISA. The test sequence is stored in the instruction RAM. A first instruction is fetched by the FAD. The fetching includes decoding the first instruction. The first instruction is translated by the code exerciser. The translating produces a first packetized communication, which is sent to the DUT. A first packetized response is received by the command interface from the DUT and reported to the user.

A processor-implemented method for testing is disclosed comprising: accessing a testing environment, wherein the testing environment includes an instruction RAM, an instruction fetch and decode unit (FAD), a code exerciser, a command interface, and a trace RAM, wherein a device under test (DUT) is accessible by the command interface, and wherein the testing environment includes a test instruction set architecture (TISA); programming a test sequence, by a user, wherein the test sequence includes one or more instructions from within the TISA; storing, in the instruction RAM, the test sequence that was programmed; fetching, by the FAD, a first instruction from the test sequence that was stored, wherein the fetching includes decoding the first instruction; translating, by the code exerciser, the first instruction, wherein the translating produces a first packetized communication, wherein the DUT is responsive to the first packetized communication; sending the first packetized communication, by the command interface, to the DUT; receiving a first packetized response, by the command interface, from the DUT, wherein the first packetized response is stored in a trace RAM; and reporting, to the user, the first packetized response that was stored in the trace RAM.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
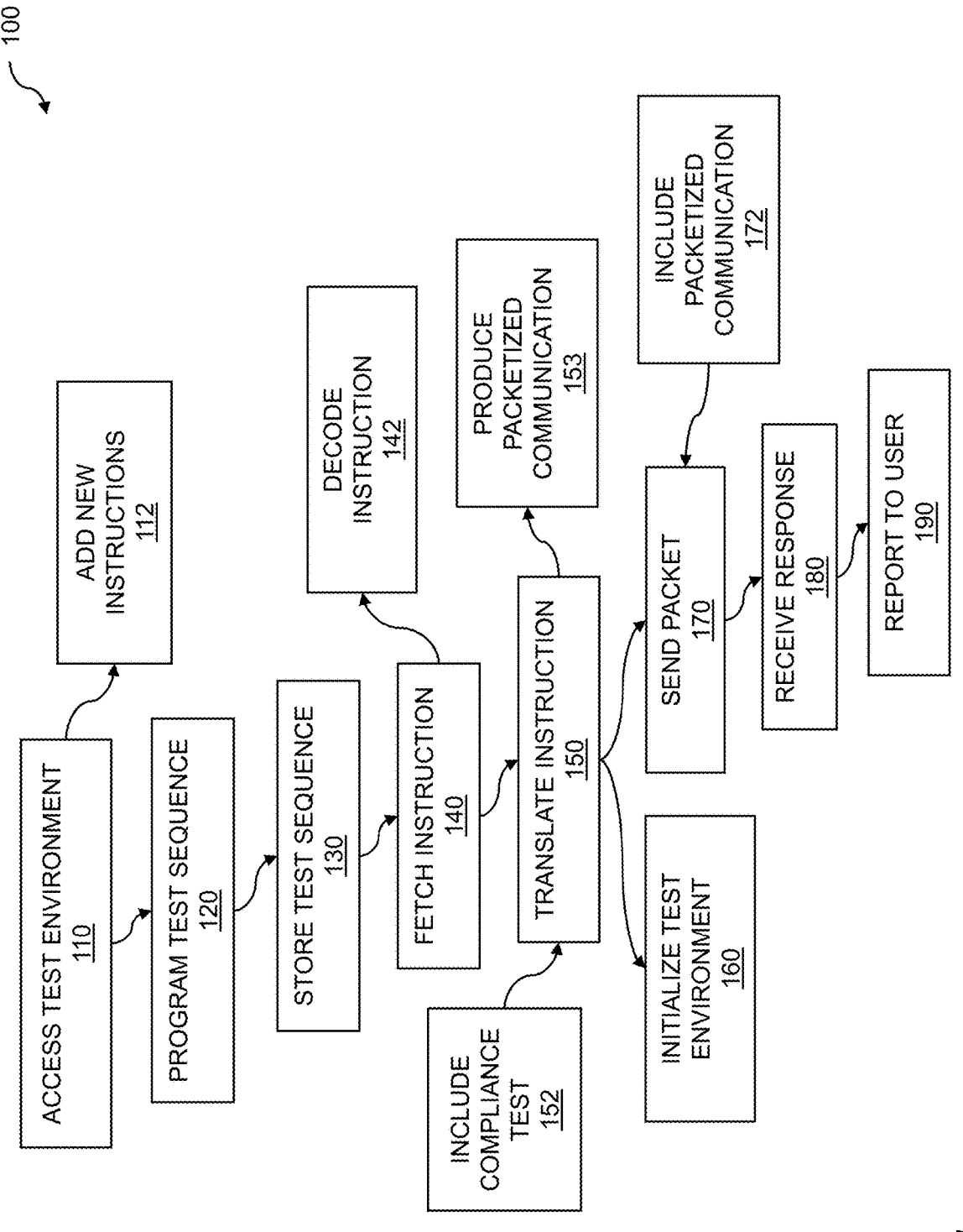
FIG. 1 is a flow diagram for a flexible test instruction set architecture.

PCI Express (PCIe) is a high-speed computer expansion bus standard used for connecting various internal components of a computer system, primarily for the purpose of data communication. PCIe is commonly used for connecting graphics cards, storage devices, network cards, and a wide variety of other peripherals to a processor via a printed circuit board (PCB) assembly. PCIe offers significantly higher data transfer rates compared to traditional PCI. It achieves the higher data transfer rates by using multiple lanes (data paths) that can be aggregated together to increase bandwidth. Each lane can carry data independently, and the total bandwidth of the bus is determined by the number of lanes used. PCIe slots come in different sizes that determine the number of lanes available for data transfer. Common sizes include x1, x4, x8, and x16, where "x" represents the number of lanes. Larger slots (x8 and x16) provide higher bandwidth and are often used for high-performance components like graphics cards. PCIe supports full-duplex communication, which means data can be sent and received simultaneously, enhancing overall data throughput. In some cases, PCIe devices and slots support hot swapping, allowing components to be added or removed from a system without shutting it down. This can be especially useful for components like external storage devices and network cards.

Unlike a shared bus architecture, with PCIe, each PCIe device is connected directly through a point-to-point link. Thus, PCIe reduces contention for the bus and improves performance. PCIe has become a fundamental part of modern computer architecture, especially in systems that require high-speed data communication between components. The ability of the PCIe to provide fast and efficient data transfer makes it crucial for various applications, including gaming, content creation, scientific computing, and data storage solutions.

Another interconnect solution that is emerging is Compute Express Link (CXL). CXL builds upon the physical and electrical interfaces of PCIe with protocols that establish coherency, simplify the software stack, and maintain compatibility with existing standards. As with PCIe, CXL offers high-speed data transfer rates to meet the demands of data-centric workloads. It achieves this through multiple lanes that can be aggregated to provide higher bandwidth. One of the unique features of CXL is memory coherency, which allows multiple devices (such as processors, GPUs, and accelerators) to share a consistent view of memory. This enables more efficient data sharing and reduces the complexity of data management. Moreover, CXL provides cache coherency, ensuring that all devices accessing shared memory have an up-to-date view of the data. The cache coherency can be implemented by a variety of protocols, such as MESI (Modified, Exclusive, Shared, Invalid) or MOESI (Modified, Owner, Exclusive, Shared, Invalid). These protocols serve to ensure that each device within the CXL fabric has a consistent view of memory, regardless of which device initiated a memory operation (read or write). In some cases, a directory-based approach is implemented to manage CXL cache coherency. With the directory approach, a central directory or memory controller can be used to keep track of which caches hold copies of specific memory locations and to monitor the state of those copies (e.g., shared, modified, invalid). When a device requests to read from or write to a memory location, the requesting device communicates with the directory, which coordinates cache coherency operations among all devices. The cache coherency reduces the need for explicit data copying and improves system efficiency. CXL is particularly well suited in data center environments where the need for high-performance communication between CPUs, GPUs, and other accelerators is critical for tasks such as artificial intelligence (AI) and machine learning (ML) computations, data analytics, and other data-intensive workloads.

As the aforementioned interconnect solutions are highly versatile, they are being used in many current and upcoming products, making the testing of systems using such interconnects an important part of successful manufacturing and deployment of such products. There are various types of testing, including ad hoc testing, stress testing, happy path testing, and compliance testing. Compliance testing for electronic devices is a crucial part of the quality assurance process and ensures that the devices meet required standards, specifications, and regulatory requirements. Compliance testing involves a series of tests and assessments that verify the performance, functionality, and reliability of the devices. The specific tests conducted can vary depending on the type of device, its intended use, and the industry standards it must meet.

Compliance testing can include functional testing. The testing can involve verifying that the device performs its intended functions correctly. Various input scenarios are applied to the device to ensure proper responses and outputs. A signal characterization test measures the device behavior under different voltage and frequency conditions. It assesses parameters such as power consumption, voltage levels, and signal integrity. A signal timing analysis evaluates device performance in terms of clock frequencies, propagation delays, and setup/hold times. Parametric tests assess the electrical parameters of the device, such as voltage, current, resistance, capacitance, and frequency. These tests can be used to confirm that the device operates within specified ranges. The aforementioned tests are just a few examples of the many types of tests that can be performed on devices. The goal of compliance testing is to confirm that devices meet quality and performance expectations, adhere to industry standards, and provide reliable functionality in their intended applications.

Techniques for the testing of devices are disclosed. A processor-implemented method includes accessing a testing environment for performing electronic testing of a device-under-test (DUT). The testing environment includes a variety of elements, including, but not limited to, a fetch and decode unit (FAD), a code exerciser, a command interface, and a trace RAM. A test sequence is programmed using a test instruction set architecture (TISA). Instructions are fetched and decoded by the FAD, and are translated by the code exerciser to produce packetized communication. The DUT is responsive to the packetized communication, and provides a packetized response that is stored in the trace RAM. The information from the trace RAM is then provided to a user as part of test results and/or analysis. The TISA provides the flexibility to support multiple interconnect standards, such as PCIe and CXL. Some embodiments can support PCIe and CXL in a single test card. Thus, disclosed embodiments can enable deep analysis for functional testing, and/or performance measurement by enhancing the instruction sets to enable both PCIe and CXL in a single test card. The programmability of the TISA provides versatility to test compliance with a variety of user-defined test inputs, thereby improving the efficiency of device testing.

Tester devices in accordance with disclosed embodiments can operate as an endpoint, or a root complex. In the context of an interconnect technology such as PCI Express (PCIe), a root complex and an endpoint are fundamental components that play important roles in the PCIe architecture. A root complex is the starting point or the root of a PCIe hierarchy within a computer system. It can be implemented on a motherboard or as part of an integrated circuit such as a system-on-chip (SoC), or a chipset. The root complex connects the processor and memory subsystems to the PCIe fabric.

The PCIe fabric can include a network or interconnection infrastructure built using the PCIe (Peripheral Component Interconnect Express) technology. The PCIe fabric enables multiple PCIe devices, such as expansion cards, sound cards, GPUs, and storage controllers, to communicate and share data with each other in a scalable and flexible manner. The PCI fabric can include one or more PCIe switches and/or PCIe fabric controllers to manage the routing of data between PCIe endpoints (devices). The switches can serve as intermediaries that connect various endpoints and direct data traffic efficiently. In some cases, the PCIe fabric can support hot plugging, meaning that PCIe devices can be added or removed from the fabric without shutting down the entire system.

A primary function of the root complex is to initiate and manage PCIe transactions. It can include a PCIe host bridge that connects the processor memory and I/O space to the PCIe fabric, enabling packetized communication between the CPU and PCIe devices. Root complexes can have multiple PCIe ports (sometimes referred to as PCIe lanes or slots) where various PCIe devices, such as graphics cards, storage controllers, network adapters, and so on, can be connected. Root complexes are responsible for assigning and managing PCIe bus numbers, handling configuration transactions, and routing data between the processor and PCIe devices.

Discussed throughout, packetized communication refers to a concept in networking that involves dividing large amounts of data into smaller packets for transmission over a network. This approach offers several advantages over traditional circuit-switched communication, such as more efficient use of network resources and the ability to handle diverse types of data. The networks in disclosed embodiments can include PCIe networks, CXL networks, and/or other networks now known or hereinafter developed. The networks can include various nodes, some of which may provide functionalities of routers and switches, to enable forwarding packets to their destinations based on the information in the packetized communication. The information in the packetized communication can include metadata such as a packet type, length of associated data, if applicable, address/routing information, message encoding, a completion status, and/or other pertinent information. The address/routing information can include, but is not limited to, a bus number, a device number, and/or a routing type.

In the context of an interconnect technology such as PCI Express (PCIe), a root complex and an endpoint are fundamental components that play important roles in the PCIe architecture. A root complex is the starting point or the root of a PCIe hierarchy within a computer system. It can be implemented on a motherboard or as part of an integrated circuit such as a SoC, or a chipset. The root complex connects the processor and memory subsystems to the PCIe fabric. A primary function of the root complex is to initiate and manage PCIe transactions. It includes a PCIe host bridge that connects the processor memory and I/O space to the PCIe fabric, enabling packetized communication between the CPU and PCIe devices. Root complexes can have multiple PCIe ports (sometimes referred to as PCIe lanes or slots) where various PCIe devices, such as graphics cards, storage controllers, network adapters, and so on, can be connected. Root complexes are responsible for assigning and managing PCIe bus numbers, handling configuration transactions, and routing data between the processor and PCIe devices.

An endpoint, also referred to as a PCIe endpoint device, can be any device connected to the PCIe bus. These devices can include various peripherals such as GPUs, SSDs, sound cards, network cards, and so on. Thus, endpoints can serve as consumers and producers of data on the PCIe bus. They can generate and receive PCIe transactions for data transfer, configuration, and communication with other devices in the system. In embodiments, each endpoint is assigned a unique PCIe device number and function number, which enables the root complex and other devices to identify and communicate with it. These numbers are part of the address/routing information that is used in addressing and routing PCIe transactions. Endpoints can be further categorized as root ports (connected directly to the root complex), switch ports (connected to PCIe switches), and downstream ports (further connected to other PCIe devices through switches).

Thus, the root complex is the central component in the PCIe hierarchy, and is responsible for managing and controlling the PCIe bus and connecting it to the CPU and system memory. Endpoints, on the other hand, are the various devices attached to the PCIe bus that perform specific functions and communicate with the root complex and other endpoints to facilitate data transfer and device interaction within the system. Disclosed embodiments provide tester devices that can act as a root complex or an endpoint, providing versatility in testing of electronic devices utilizing an interconnect technology such as PCIe and/or CXL.

FIG. 1 is a flow diagram for a flexible test instruction set architecture. The flow includes accessing a test environment 110. The test environment can include a combination of hardware and software to provide testing capabilities for a device-under-test (DUT). The various elements of the testing environment can include a computer, processors, integrated circuits, application specific integrated circuits (ASICs), programmable devices such as field programmable gate arrays (FPGAs), and so on. The test environment can configure hardware for testing; apply a single instruction or instruction sequences to a DUT for testing; change voltages, timings, skew, etc., at the DUT; receive inputs back from the DUT; compare actual results to expected results; and so on. The test environment can include a test instruction set architecture (TISA). The TISA can comprise one or more data words. In embodiments, a first data word within the one or more data words comprises 32 bits. The TISA can include an opcode field. In embodiments, the opcode field comprises 5 bits. In some embodiments, the opcode field is configurable with some bits to identify a test suite or type. The opcode field can be of variable size. Additional bits can be allocated to the opcode field to provide up to 2^N opcodes, where N is the total number of bits in the opcode field. The opcodes can represent instructions or microcode that comprises tests to be performed on the DUT. In embodiments, the TISA includes control and exerciser instructions. The data word can include multiple argument fields. The instructions within the TISA can perform a wide variety of functions for configuring, initializing, and executing testing of the DUT.

The flow 100 can include adding, to the TISA, one or more new instructions 112. The new instructions can exercise a DUT, a second DUT, and/or other devices to be tested. The new instructions can be mapped to unused opcodes. The flow 100 includes programming a test sequence 120. The test sequence can be programmed by a user, where the test sequence includes one or more instructions from within the TISA. The test sequence can include a variety of individual tests. These tests can include signal integrity requirements, such as rise time, fall time, jitter, and signal voltage level, for a transmitter and/or receiver. The tests can be used to confirm that the aforementioned parameters are within acceptable limits. The tests can include protocol tests, such as transaction layer packet tests, to check for proper packet generation, ordering, and flow control. The tests can further include packet error testing to evaluate how a device handles errors, such as CRC errors, flow control errors, and/or other error conditions. Other tests can include, but are not limited to, base specification testing, power management testing, hot-plug and hot-swap testing, and so on. In embodiments, the programming includes a language such as C, C++, Python, or another language. A high-level compiler can transform the test sequence into TISA instructions that are understood by the test environment.

The flow 100 continues with storing the test sequence 130. This can include storing, in the instruction RAM, the test sequence that was programmed. Storing the test sequence can include any memory element, including dynamic random-access memory (DRAM), HBM (High Bandwidth Memory), DDR4 (Double Data Rate 4) RAM, DDR5 (Double Data Rate 5) RAM, or another suitable DRAM type. In some embodiments, the storing the test sequence can include static RAM (SRAM).

The flow 100 continues with fetching an instruction 140, and decoding the instruction 142. The fetching and decoding can be accomplished with a fetch and decode unit (FAD). Thus, this can include fetching, by the FAD, a first instruction from the test sequence that was stored, where the fetching includes decoding the first instruction. The flow 100 continues with translating the instruction 150, and producing packetized communication 153. This can include translating, by the code exerciser, the first instruction, where the translating produces a first packetized communication, where the DUT is responsive to the first packetized communication. In embodiments, the code exerciser expands the instruction to include multiple commands to the DUT. Thus, the opcodes can operate as microcode instructions, where the microcode instruction is translated into one or more low level instructions that are understood by the test environment. The flow 100 can include a compliance test 152. The compliance test can include a full compliance test on the DUT, by the testing environment. The compliance test 152 can include a suite of tests, called compliance verification tests, that exercise certain features of the DUT. The compliance verification tests can include expected outputs to compare to the DUT's response. The compliance verification tests can be saved and reused for testing other DUTs. In one or more embodiments, the compliance test can include an endpoint-root complex compatibility test suite. PCIe endpoints (devices) and root complexes (host controllers) are intended to interoperate with each other. The compliance testing serves to verify that different combinations of PCIe devices and host controllers can function correctly and can exchange data as expected. Other compliance tests can involve lane configurations. For example, PCIe supports different lane configurations (e.g., x1, x4, x8, x16). Compliance tests supported by disclosed embodiments can include interoperability testing that assesses whether devices can establish and maintain multi-lane links properly. Other compliance tests such as CXL can be included in disclosed embodiments. Example tests can include various plug speeds, lane restrictions, fault injections, and so on. In embodiments, the compliance tests can include ethernet protocols.

The flow 100 can include initializing a test environment 160. In embodiments, the initializing includes control instructions in the TISA. The initializing can include setting of various parameters, including, but not limited to, clock speeds, voltage levels, data bus widths, communication protocols, link speed, and/or lane configuration. The lane configuration can include, but is not limited to, a PCIe x1 configuration, PCIe x2 configuration, PCIe x4 configuration, PCIe x8 configuration, PCIe x16 configuration, and/or a PCIe x32 configuration. The PCIe x1 configuration refers to a single lane, providing one bidirectional data lane. While the PCIe x1 configuration provides the lowest bandwidth among PCIe configurations, it is useful for tasks with moderate data transfer requirements, such as sound cards or network adapters. PCIe x2 utilizes two lanes, effectively doubling the bandwidth compared to PCIe x1, offering improved performance for certain applications like data acquisition cards. PCIe x4 provides even more bandwidth than PCIe x2. It is commonly used for devices that require higher data transfer rates, such as solid-state drives (SSDs), USB expansion cards, and network controllers. PCIe x16 is an important lane configuration and is often utilized with high-end graphics cards. PCIe x16 provides 16 lanes for data transfer, offering the highest bandwidth among common PCIe configurations. The PCIe x16 is well suited for demanding, time-critical tasks in applications such as gaming, 3D rendering, and scientific computing. Disclosed embodiments can be used to test the aforementioned configurations, as well as other configurations now known, or hereinafter developed.

The flow 100 can include sending a packet 170, and including packetized communication 172. This can include sending the first packetized communication, by the command interface, to the DUT. The DUT can process the packetized communication and respond with another packet. Thus, the flow 100 can include receiving a response 180. This can include receiving a first packetized response, by the command interface, from the DUT, where the first packetized response is stored in a trace RAM. The trace RAM can comprise any memory element, including dynamic random-access memory (DRAM). In one or more embodiments, the trace RAM is comprised of HBM (High Bandwidth Memory), DDR4 (Double Data Rate 4) RAM, DDR5 (Double Data Rate 5) RAM, or another suitable DRAM type. In some embodiments, the trace RAM can include static RAM (SRAM).

The flow 100 can then include providing a report to a user 190. This can include reporting, to the user, the first packetized response that was stored in the trace RAM. In embodiments, the report interprets the packetized response for the user. For example, the report can identify that there was a missing payload in an expected PCIe transaction and can inform the user. The report can include multiple packets back and forth between the test environment and the DUT. In other embodiments, the report includes an expected response in addition to the measured response from the DUT by the testing environment. In further embodiments, the report can include signal integrity such as voltage levels, timing of responses, and so on.

Various steps in the flow 100 may be changed in order, repeated, omitted, or the like without departing from the disclosed concepts. Various embodiments of the flow 100 can be included in a computer program product embodied in a non-transitory computer readable medium that includes code executable by one or more processors. Various embodiments of the flow 100, or portions thereof, can be included on a semiconductor chip and implemented in special purpose logic, programmable logic, and so on.

Figure 2:
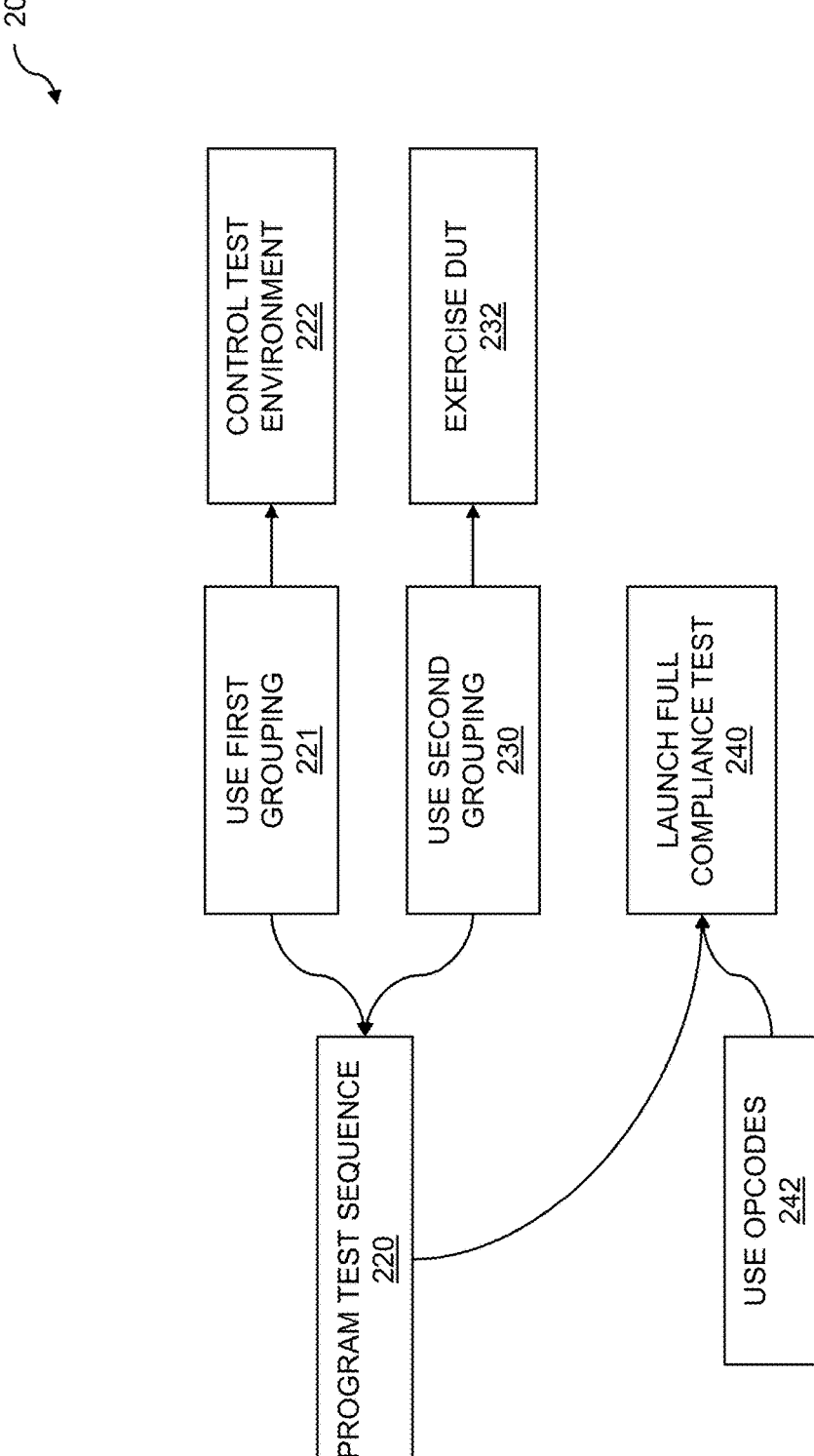
FIG. 2 is a flow diagram for grouping a flexible test instruction set architecture (TISA).

FIG. 2 is a flow diagram for grouping a flexible test instruction set architecture (TISA). The flow 200 can include programming a test sequence 220. The test sequence can include one or more instructions from within the TISA. The flow 200 can include using a first grouping 221. The flow 200 can further include controlling the test environment 222. In embodiments, the first grouping of opcodes control the testing environment. In embodiments, the opcodes included within the first grouping can initialize a testing environment by establishing parameters including, but not limited to, voltage levels, clock speeds, data bus widths, communication protocols, lane configuration (such as x1, x4, x8, and x16), link speed, and so on. The flow 200 can include using a second grouping 230. The flow 200 can further include exercising the DUT 232. In embodiments, the DUT comprises a PCIExpress (PCIe) controller. In other embodiments, the DUT comprises a Compute Express Link (CXL) controller. In further embodiments, the DUT comprises an ethernet controller. Other controllers can be tested as the DUT. In embodiments, the opcodes included within the second grouping can perform various tests on the DUT. These can include, but are not limited to, data transfer tests, speed tests, clock jitter tests, memory read/write tests, redundancy tests, and so on. The flow 200 can include launching a full compliance test 240. The full compliance test can include multiple tests to execute on the DUT. The tests can include, but are not limited to, link layer testing and transaction layer testing. The flow 200 can include using opcodes 242. In embodiments, the TISA includes a plurality of opcodes. Embodiments can further include launching, by one or more opcodes within the plurality of opcodes, a full compliance test on the DUT, by the testing environment. The opcodes can provide a variety of functions, including, but not limited to, resetting a test system, arming a test system, disarming a test system, accessing and/or configuring a trace buffer of a test system, reading/writing data to a DUT, and so on. Some opcodes may include one or more possible arguments, enabling individual opcodes to provide multiple functions. As an example, an opcode to read configuration data from a DUT can include a first argument to specify the information to be read. A first value for the first argument can correspond to a vendor identifier (ID), a second value for the first argument can correspond to the first 256 bytes, and a third value for the first argument can correspond to extended configuration space. Additional values and/or arguments are possible for opcodes of the TISA, providing an extensible, flexible, test architecture for testing interconnect systems such as PCIe, CXL, and the like.

Various steps in the flow 200 may be changed in order, repeated, omitted, or the like without departing from the disclosed concepts. Various embodiments of the flow 200 can be included in a computer program product embodied in a non-transitory computer readable medium that includes code executable by one or more processors. Various embodiments of the flow 200, or portions thereof, can be included on a semiconductor chip and implemented in special purpose logic, programmable logic, and so on.

Figure 3:
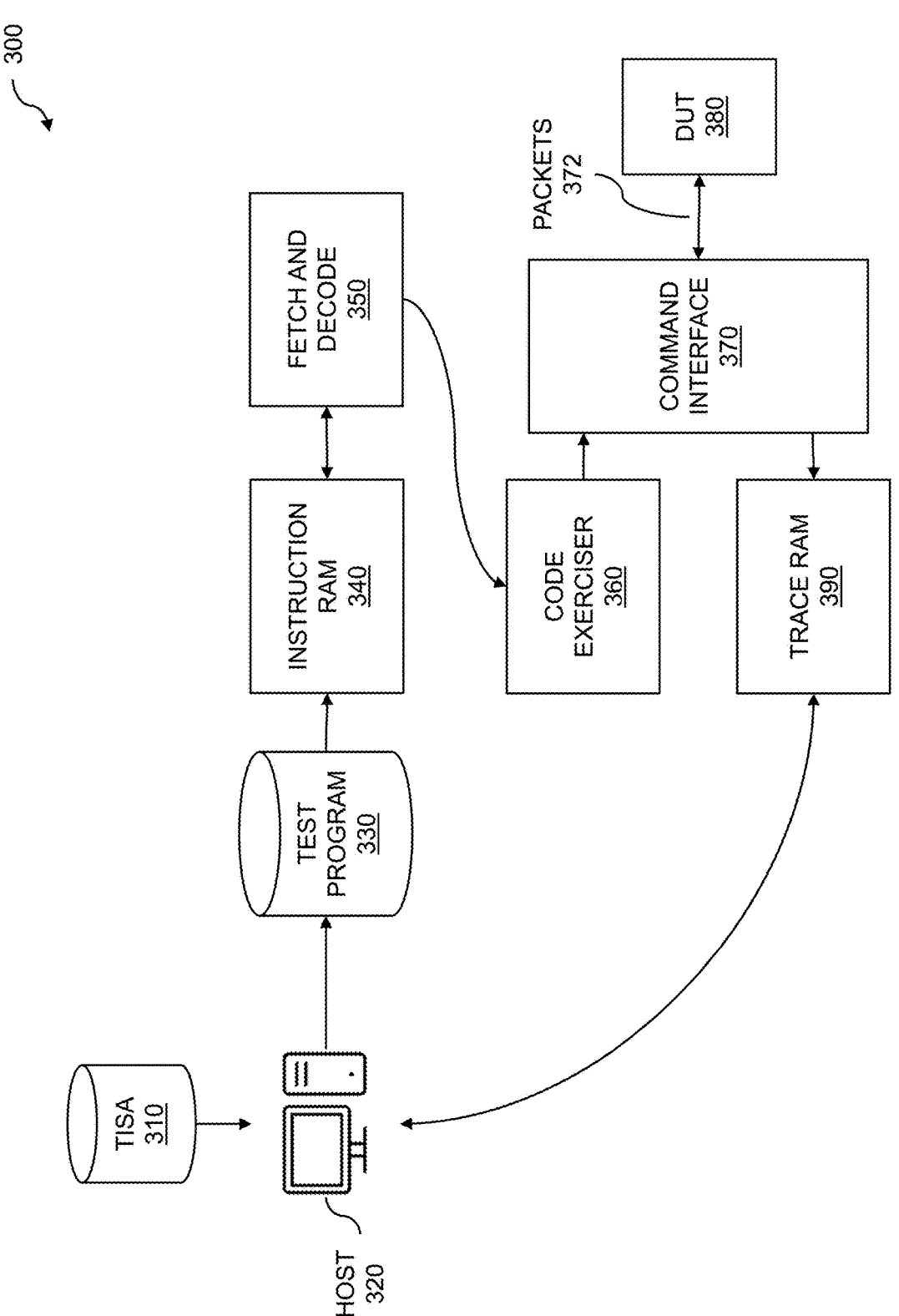
FIG. 3 is a block diagram for a flexible instruction set architecture.

FIG. 3 is a block diagram for a flexible instruction set architecture. The architecture block diagram 300 includes a test instruction set architecture (TISA) 310. The TISA can include a plurality of opcodes. The opcodes can include opcodes for configuring and/or initializing a test environment, as well as opcodes for performing tests on a device-under-test (DUT). The TISA 310 can be loaded on, or be made accessible to, a host 320. The host 320 can include a computer, such as a desktop or laptop computer. The host 320 can include one or more applications executing thereon, such as compilers, linkers, assemblers, and/or other programs for the purposes of assembling a sequence of opcodes from the TISA 310 into a test program 330. The test program 330 can then be loaded into instruction random-access memory (RAM) 340. The instruction RAM 340 can include dynamic random-access memory (DRAM). In one or more embodiments, the instruction RAM 340 is comprised of HBM (High Bandwidth Memory), DDR4 (Double Data Rate 4) RAM, DDR5 (Double Data Rate 5) RAM, or another suitable DRAM type. In some embodiments, the instruction RAM 340 can include static RAM (SRAM).

A fetch and decode (FAD) block 350 provides instructions from the instruction RAM 340 to the code exerciser 360. The FAD block 350 performs functions to enable execution of opcodes in the TISA. The FAD block 350 can include a fetch stage. The fetch stage is the first step in the instruction execution cycle. The primary function of the fetch is to retrieve the next instruction from memory. The FAD may utilize input based on a program counter (PC) or instruction pointer to determine the memory address of the next instruction to be fetched. In embodiments, the fetch operation involves reading the instruction from the specified memory location in the instruction RAM and loading it into an instruction register within the code exerciser in preparation for execution of the instruction. The FAD block 350 may also include a decode stage. The decode stage can include examination of additional operands and/or arguments, address identification, and so on. The code exerciser can include a combination of hardware, software, and/or microcode for translating instructions into packetized communication. In embodiments, some opcodes within the TISA cause the code exerciser to create a single targeted packetized communication to the DUT. In other embodiments, some opcodes within the TISA cause the code exerciser to create multiple packetized communications, creating a hierarchical, flexible testing environment. Additional opcodes can be added to the TISA. The packetized communication is sent via command interface 370, sending packets 372 to the DUT 380. In embodiments, the DUT comprises an ethernet controller. In other embodiments, the DUT can include a graphics card (GPU), a sound card, a data acquisition card, a special-purpose device, and/or other devices that utilize an interconnect protocol such as PCIe, CXL, ethernet, or the like. The DUT can respond to incoming packets with response packets that are sent, via the command interface 370, to trace RAM 390. In embodiments, the sending comprises simulated traffic from a PCIe root complex. In embodiments, the sending comprises simulated traffic from a PCIe endpoint. The trace random-access memory (RAM) 390 is a memory buffer that can include trace information. The trace information from trace RAM 390 can be accessed by host 320 so that a user operating the host 320 can observe the trace information, to obtain details regarding how the DUT performed to the test or tests included in the test program 330.

The trace information can include physical layer transmit information, physical layer receive information, data link layer receive information, data link layer transmit information, transaction layer transmit information, and transaction layer receive information, as well as additional tracing for general PCIe controller information. Control of the trace RAM 390 can be enabled via one or more opcodes from the TISA 310. The control functions can include transferring the contents of trace RAM 390 to host 320. The control functions can include clearing the trace RAM 390. In some embodiments, writing to the trace RAM 390 is halted in response to detecting an error in a DUT. This feature can allow inspection of the contents of trace RAM 390 immediately after a DUT error is detected, to enable convenient analysis of a test failure. The trace RAM 390 can include dynamic random-access memory (DRAM). In one or more embodiments, the trace RAM 390 is comprised of DDR4 (Double Data Rate 4) RAM, DDR5 (Double Data Rate 5) RAM, HBM (High Bandwidth Memory), or another suitable DRAM type. In some embodiments, the trace RAM 390 can include static RAM (SRAM).

Figure 4:
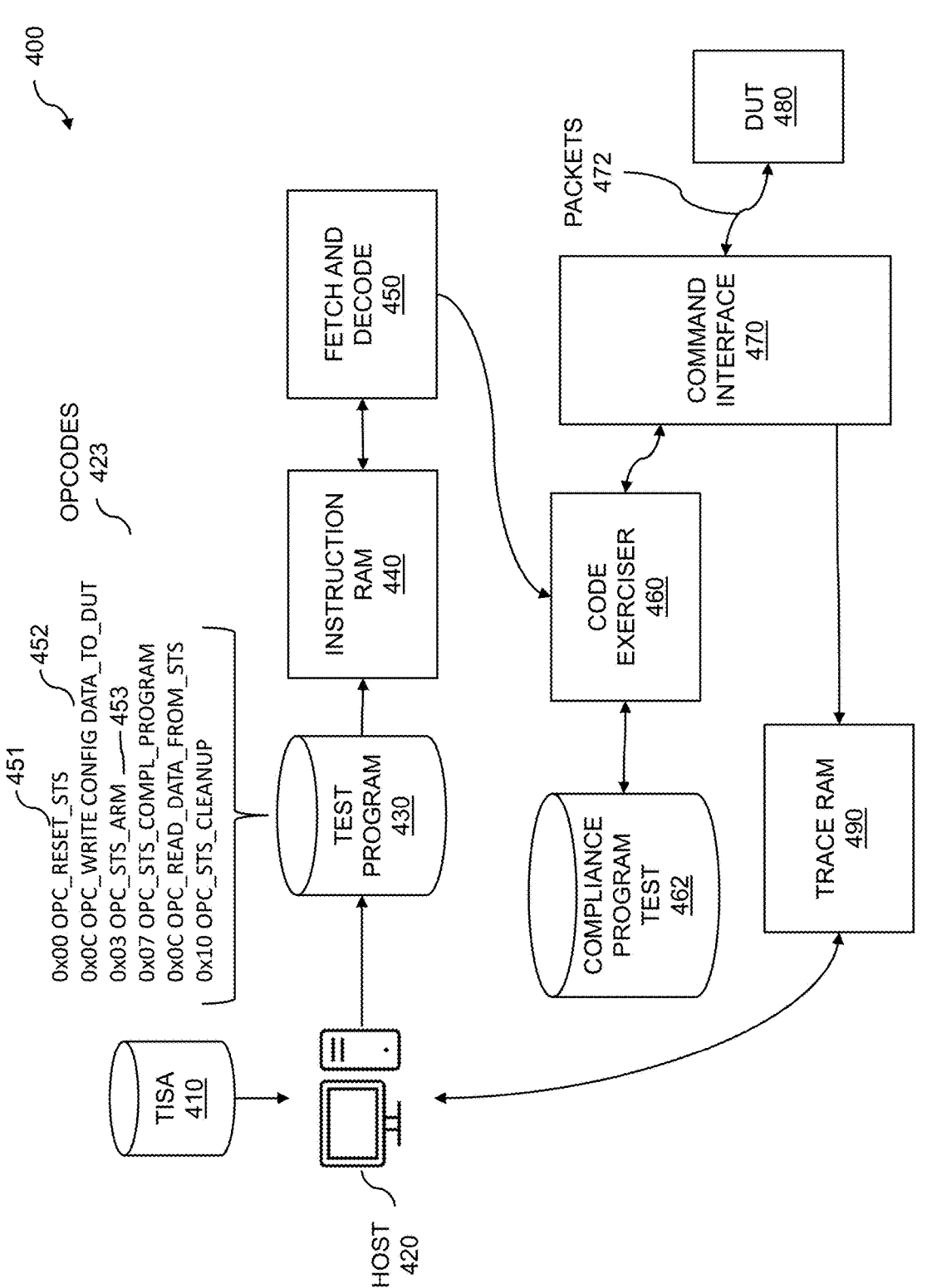
FIG. 4 is a block diagram for a full compliance test set with a flexible TISA.

FIG. 4 is a block diagram for a full compliance test set with a flexible TISA. Similar to what is shown in FIG. 3, the diagram 400 includes a test instruction set architecture (TISA) 410. The TISA can include a plurality of opcodes. The opcodes can include opcodes for configuring and/or initializing a test environment, as well as opcodes for performing tests on a device-under-test (DUT). The TISA 410 can be loaded on to, or can be made accessible to, a host 420. The host 420 can include a computer, such as a desktop or laptop computer. The host 420 can include one or more applications executing thereon, such as compilers, linkers, assemblers, and/or other programs for the purposes of assembling a sequence of opcodes 423 from the TISA 410 into a test program 430. The test program 430 can then be loaded into instruction RAM 440. A fetch and decode (FAD) block 450 provides instructions from the instruction RAM 440 to the code exerciser 460. The code exerciser can include a combination of hardware, software, and/or microcode for translating instructions into packetized communication. The opcodes 423 can include a first instruction 451, a second instruction 452, a third instruction 453, and multiple additional instructions. In embodiments, the opcodes 423 can cause the code exerciser 460 to retrieve a full compliance program test 462, and send the full compliance program test, via packetized communication, via command interface 470, thereby sending packets 472 to the DUT 480. In embodiments, the compliance test includes a PCIe compliance test suite (CTS).

In embodiments, the PCIe CTS can include a variety of tests for exercising a DUT. The PCIe CTS can include a set of tests and procedures used to confirm that PCIe-based devices, such as expansion cards, GPUs, sound cards, data acquisition cards, motherboards, and other hardware components, comply with the PCIe specification and standards. These tests are designed to verify the interoperability, performance, and reliability of PCIe devices. The tests can include protocol tests. The protocol tests can include Transaction Layer Packet Tests (TLPTs). The TLPTs examine the PCIe transaction layer to confirm that it adheres to the PCIe protocol standards. The TLPTs can exercise various transaction layer functions, including, but not limited to, memory read, memory write, I/O read, I/O write, and so on. The tests can further include link layer tests. The link layer tests can be used to evaluate the link training, initialization, and management processes. The tests can further include data link layer tests. The data link layer tests can be used to assess data integrity, error handling, and/or flow control mechanisms. The PCIe CTS can further include performance testing. The performance testing can include, but is not limited to, bandwidth testing and throughput testing. The bandwidth and/or throughput tests measure the data transfer rates achievable by the DUT, confirming that the DUT meets the intended standards. The performance testing can also include latency tests. Latency tests assess the time it takes for data to travel between the PCIe device and the host system, ensuring it falls within acceptable limits.

The PCIe CTS can further include interoperability tests. These tests can include plug-and-play tests. The plug-and-play tests check if the PCIe device can be detected and configured correctly when plugged into different PCIe slots or systems. The interoperability tests can further include compatibility tests. The compatibility tests can confirm that the PCIe device can communicate and operate as expected with various system configurations and other PCIe devices. The PCIe CTS can further include certification tests. These tests can include tests that are also conducted by official PCIe certification organizations, to confirm that a DUT complies with PCIe standards. The PCIe CTS can further include BIOS/firmware tests. The BIOS/firmware tests can confirm that the PCIe device interacts correctly with the system's firmware and BIOS. Other PCIe CTS tests are possible in disclosed embodiments.

In addition, DUT 480 can comprise an entire silicon system or subsystem, for example, a system on chip (SOC), whether or not the system or subsystem includes a PCIe, CXL, or another such controller. The test environment can support a number of different testing regimes of the DUT, including functional testing, error and exception testing, and functional safety testing. Functional safety testing can include having the test environment initiate, control, and/or monitor a built-in-self-test (BIST) running on the DUT.

The DUT can respond to incoming packets with response packets that are sent, via the command interface 470, to trace RAM 490. The trace information from trace RAM 490 can be accessed by the host 420 so that a user operating the host 420 can observe the trace information and can obtain details regarding how the DUT performed to compliance test 462. Thus, in some embodiments, one or more opcodes within test program 430 can cause the code exerciser 460 to fetch additional opcodes and/or instructions from a compliance program test 462, and send the instructions for the full compliance test, via packets 472, to the DUT 480. Accordingly, in some embodiments, the test program 430 includes references to full compliance tests that can be retrieved from a data store, and can be sent to a DUT for execution. A full compliance test can include 10, 20, 40, 100, or more test cases. With disclosed embodiments, the TISA provides the flexibility to specify many tests with a small number of opcodes organized into a test program 430 that references one or more compliance tests. In embodiments, the compliance program test 462 is an industry standard suite of tests launched by the code exerciser 460 after executing one or more opcodes 423. In other embodiments, the compliance test is a proprietary test suite that has been shown to thoroughly exercise the DUT.

Figure 5:
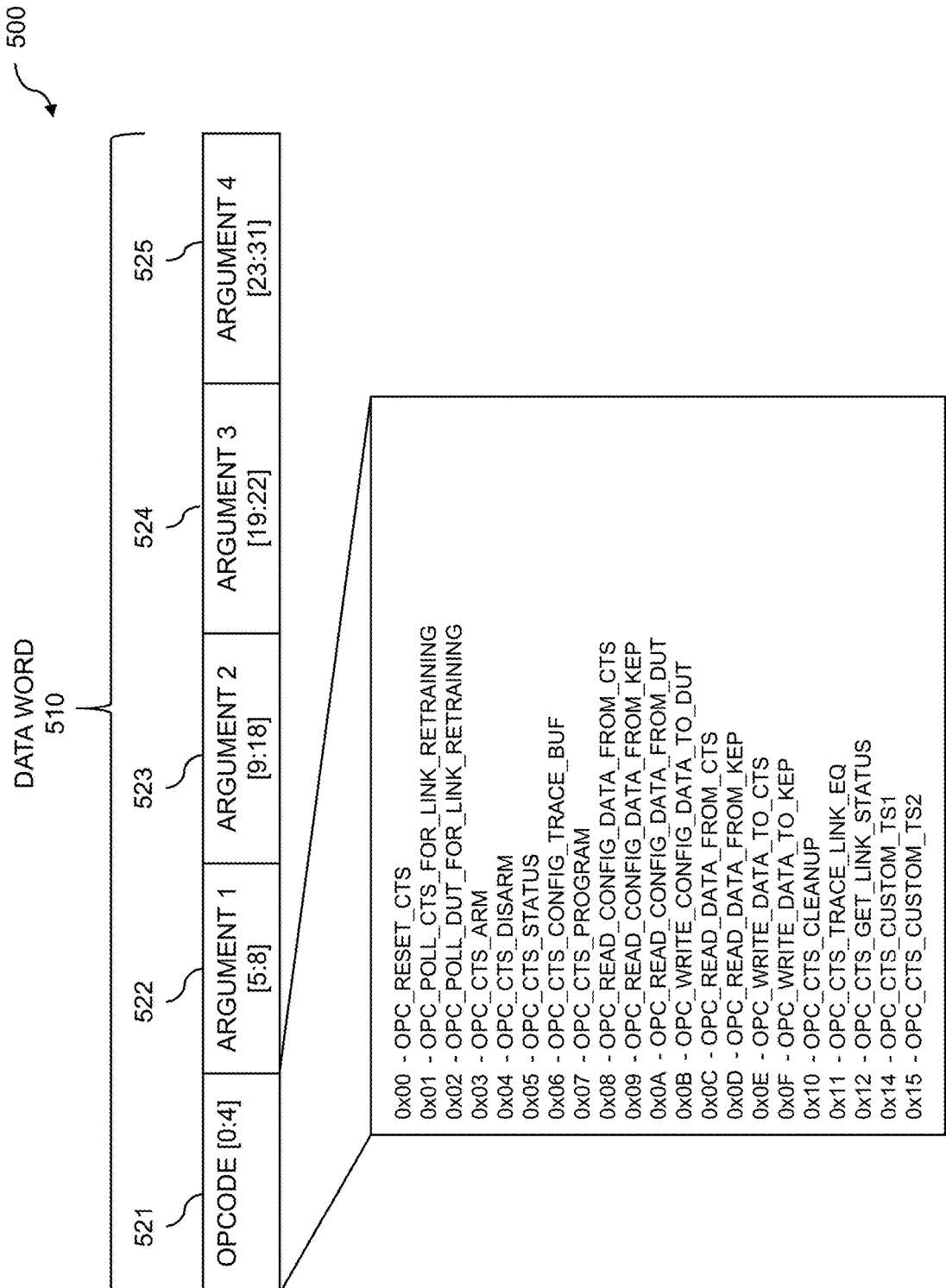
FIG. 5 is an opcode listing for a flexible TISA.

FIG. 5 is a diagram showing an opcode listing for a flexible TISA. In embodiments, the TISA comprises one or more data words. In embodiments, a first data word within the one or more data words comprises 32 bits. As shown in the diagram 500, data word 510 comprises 32 bits, divided into multiple bit fields. A first bit field includes an opcode field 521. In embodiments, the opcode field comprises 5 bits. A first argument field 522 includes bits for a first argument. In embodiments, the first argument field comprises 4 bits. A second argument field 523 includes bits for a second argument. In embodiments, the second argument field comprises 10 bits. A third argument field 524 includes bits for a third argument. In embodiments, the third argument field comprises 4 bits. A fourth argument field 525 includes bits for a fourth argument. In embodiments, the fourth argument field comprises 9 bits.

In some embodiments, the data word can be another length besides 32 bits, such as 48 bits, 64 bits, 128 bits, and so on. While the embodiment shown in FIG. 5 includes four argument fields (522-525), some embodiments may have more or fewer argument fields. Moreover, in embodiments, some opcodes may use fewer than four arguments, and some opcodes may not use any arguments. The instructions can perform a wide variety of functions for configuring and initializing test environments, as well as executing tests for a root complex and/or endpoint. As an example, the instruction: 0x01, OPC_POLL_CTS_FOR_LINK_RETRAINING can support monitoring of the link status of a test environment after a link retrain. This instruction can cause the test environment of disclosed embodiments to periodically check the link status for retraining to complete. If the link does not successfully retrain within a specified period, this is treated as a test failure and the test is aborted. In another example, the instruction 0x02, OPC_POLL_DUT_ FOR_LINK_RETRAINING monitors a link status of a root port, after a link retrain, periodically checking the link status for retraining to complete. If the link does not successfully retrain within the specified period, it can be considered a test failure. In another example, the instruction 0x03, OPC_ CTS_ARM enables a test card to act on test conditions already programmed into it, and also enables the trace RAM.

Similarly, instruction 0x04, OPC_CTS_DISARM disables the test card, and also stops trace RAM acquisition. In another example, the instruction 0x05, OPC_CTS_STATUS checks progress regarding how many of the tests have been executed. In embodiments, the instruction causes a periodic poll for intervals up to 10 milliseconds. In another example, the instruction 0x06, OPC_CTS_CONFIG_TRACE_BUF programs a test card to capture desired traffic. In embodiments, the instruction 0x06 accepts arguments, including, but not limited to, a direction field, to indicate a direction of traffic to be captured, and a filter field, which specifies the amount of packet information that is to be captured in the given direction.

In another example, the instruction 0x07, OPC_ CTS_PROGRAM programs the test system to generate a desired test condition. A variety of arguments can be used with instruction 0x07. One argument can include an action argument specifying test conditions that the test environment can generate. Another argument can refer to a type of error to be injected during a test. Another such argument can include a pattern matching argument, to specify a matching condition for a transaction layer packet and/or a data link layer packet. Other types of patterns can be matched in disclosed embodiments. In another example, the instruction 0x0C, OPC_READ_DATA_FROM_CTS reads configuration data from the test environment. The data can be a byte, word, double-word, or other suitable size. In some embodiments, an argument can be used to specify a number of bytes to read. In another example, the instruction 0x0D, OPC_RE- AD_DATA_FROM_KEP reads configuration data from a known endpoint. The data can be a byte, word, double-word, or another suitable size. In another example, the instruction 0x0E, OPC_WRITE_DATA_TO_CTS can write configuration data to memory within the test card as referenced by a base address register (BAR). The instruction 0x0E can include one or more arguments, including, but not limited to, a byte count, a base address register identifier, a data pattern, a lower start address value, and/or an upper start address value. The aforementioned instructions are just some of the many different instructions that are possible within the TISA of disclosed embodiments.

While one data word 510 is shown in the diagram 500, in practice, there can be many data words in a test sequence. Embodiments can include a first data word, a second data word, a third data word, and so on. In embodiments, a second data word comprises 32 bits, and the second data word includes a first data pattern or a start address. In embodiments, a third data word comprises 32 bits, and the third data word includes a second data pattern, and so on.

Figure 6:
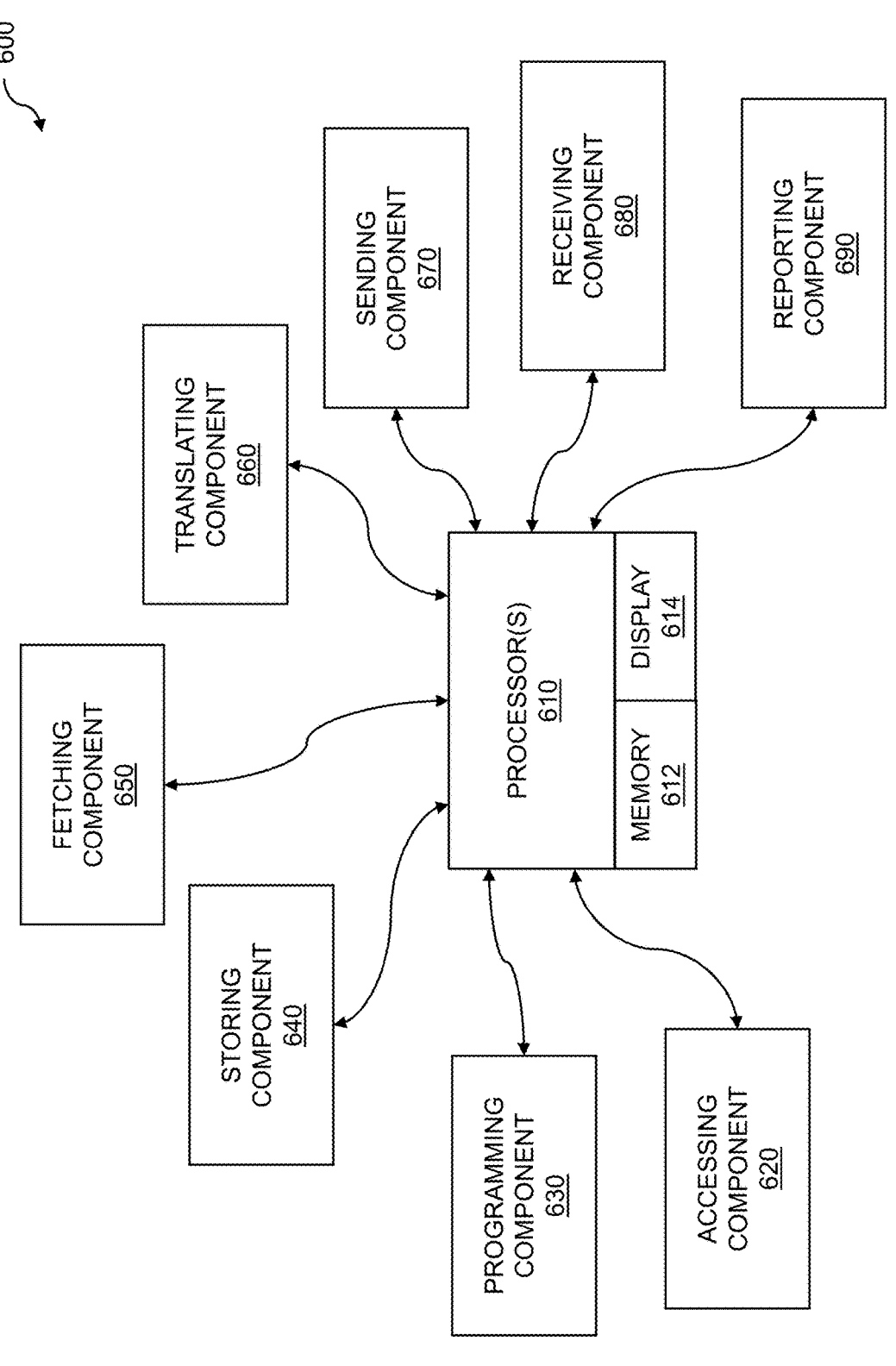
FIG. 6 is a system diagram for a flexible test instruction set architecture.

FIG. 6 is a system diagram for a flexible test instruction set architecture. The system 600 can include one or more processors 610, which are coupled to a memory 612 which stores instructions. The system 600 can further include a display 614 coupled to the one or more processors 610 for displaying data, intermediate steps, directions, and control words; creating sequences of opcodes, arguments, test scripts, and compliance tests; and so on. In embodiments, one or more processors 610 are coupled to the memory 612, wherein the one or more processors, when executing the instructions which are stored, are configured to: access a testing environment, wherein the testing environment includes an instruction RAM, an instruction fetch and decode unit (FAD), a code exerciser, a command interface, and a trace RAM, wherein a device under test (DUT) is accessible by the command interface, and wherein the testing environment includes a test instruction set architecture (TISA); program a test sequence, by a user, wherein the test sequence includes one or more instructions from within the TISA; store, in the instruction RAM, the test sequence that was programmed; fetch, by the FAD, a first instruction from the test sequence that was stored, wherein the fetching includes decoding the first instruction; translate, by the code exerciser, the first instruction, wherein the translating produces a first packetized communication, wherein the DUT is responsive to the first packetized communication; send the first packetized communication, by the command interface, to the DUT; receive a first packetized response, by the command interface, from the DUT, wherein the first packetized response is stored in a trace RAM; and report, to the user, the first packetized response that was stored in the trace RAM.

In embodiments, the memory 612 can be used to store data such as scratchpad data, fetched instructions, opcodes, arguments, trace RAM data, and so on. In embodiments, the data can include multiple groupings of opcodes, including, but not limited to, a first grouping of opcodes that controls the testing environment, and a second grouping of opcodes that exercises the DUT. The opcodes that control the testing environment can perform initialization functions such as voltage levels, clock speeds, data bus widths, communication protocols, lane configuration (such as x1, x4, x8, and x16), link speed, and so on. The opcodes that exercise the DUT can include, but are not limited to, data transfer tests, speed tests, response tests, clock jitter tests, memory read/write tests, redundancy tests, and so on. An example of a response test can include confirming that a DUT retransmits a transaction for which a NAK has been issued. Embodiments can also include non-response tests. A non-response test can include tests to confirm that a DUT properly ignores a packet. Ignoring reserved data can be important for purposes of data integrity, security, and/or resource efficiency. Unexpected data in reserved fields can be due to corrupt, incomplete, or improperly formatted information. Additionally, malicious actors may attempt to inject erroneous or manipulated data packets into a system to exploit vulnerabilities or compromise security. Ignoring data in reserved fields is a safety technique that helps prevent security breaches, data breaches, and unauthorized access. Thus, non-response tests can be an essential component in a compliance test suite supported by a TISA of disclosed embodiments. An example of a non-response test can include confirming that the DUT ignores reserved fields in an ACK DLLP (Data Link Layer Packet). Other tests are possible in disclosed embodiments.

The system 600 can include an accessing component 620. The accessing component 620 can include instructions and functions for accessing a testing environment, where the testing environment includes an instruction RAM, an instruction fetch and decode unit (FAD), a code exerciser, a command interface, and a trace RAM, and where a device under test (DUT) is accessible by the command interface. The system 600 can further include a programming component 630. The programming component 630 can include instructions and functions for programming a test sequence, by a user, wherein the test sequence includes one or more instructions from within the TISA.

The system 600 can further include a storing component 640. The storing component 640 can include instructions and functions for storing, in the instruction RAM, the test sequence that was programmed. The system 600 can further include a fetching component 650. The fetching component 650 can include instructions and functions for fetching, by the FAD, a first instruction from the test sequence that was stored, wherein the fetching includes decoding the first instruction. The system 600 can further include a translating component 660. The translating component 660 can include instructions and functions for translating, by the code exerciser, the first instruction, wherein the translating produces a first packetized communication, wherein the DUT is responsive to the first packetized communication. The system 600 can further include a sending component 670. The sending component 670 can include instructions and functions for sending the first packetized communication, by the command interface, to the DUT.

The system 600 can further include a receiving component 680. The receiving component 680 can include instructions and functions for receiving a first packetized response, by the command interface, from the DUT, wherein the first packetized response is stored in a trace RAM. In embodiments, the data stored in the trace RAM can include values, timestamps, command history, error codes, and/or other information for observing the execution of a DUT. The system 600 can further include a reporting component 690. The reporting component 690 can include instructions and functions for reporting, to the user, the first packetized response that was stored in the trace RAM. The reporting can include multiple data fields including information relating to a test. The information can include, but is not limited to, a DUT ID (identifier), a date and time of the test, a name of the test or test suite that was executed, an overall test result, an overall execution time, and so on. The reporting can provide a comprehensive assessment of the performance and/or compliance of a DUT.

The system 600 can include a computer program product embodied in a non-transitory computer readable medium for instruction execution, the computer program product comprising code which causes one or more processors to perform operations of: accessing a testing environment, wherein the testing environment includes an instruction RAM, an instruction fetch and decode unit (FAD), a code exerciser, a command interface, and a trace RAM, wherein a device under test (DUT) is accessible by the command interface, and wherein the testing environment includes a test instruction set architecture (TISA); programming a test sequence, by a user, wherein the test sequence includes one or more instructions from within the TISA; storing, in the instruction RAM, the test sequence that was programmed; fetching, by the FAD, a first instruction from the test sequence that was stored, wherein the fetching includes decoding the first instruction; translating, by the code exerciser, the first instruction, wherein the translating produces a first packetized communication, wherein the DUT is responsive to the first packetized communication; sending the first packetized communication, by the command interface, to the DUT; receiving a first packetized response, by the command interface, from the DUT, wherein the first packetized response is stored in a trace RAM; and reporting, to the user, the first packetized response that was stored in the trace RAM.

As can now be appreciated, disclosed embodiments provide improvements in the technical field of interconnect testing, such as PCIe testing, CXL testing, or the like. With the flexible test instruction set architecture (TISA) of disclosed embodiments, the testing of electronic devices and/or components that support interconnect standards is greatly simplified. Additionally, the test environment of disclosed embodiments enables support of multiple interconnect standards with a single test card, via the TISA. Moreover, in embodiments, the TISA can be extensible, and more opcodes can be added or modified as new devices and tests emerge. Furthermore, opcodes within the TISA have the flexibility to reference full compliance tests, enabling a small number of opcodes within the TISA to perform multiple tests. The trace RAM and reporting features provided high visibility into the operation, performance, and compliance of a DUT, enabling improved quality for deployed products.

Each of the above methods may be executed on one or more processors on one or more computer systems. Embodiments may include various forms of distributed computing, client/server computing, and cloud-based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general-purpose hardware and computer instructions, and so on.

A programmable apparatus which executes any of the above-mentioned computer program products or computer-implemented methods (i.e., processor-implemented methods) may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are limited to neither conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM); an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States, then the method is considered to be performed in the United States by virtue of the causal entity.

While the invention has been disclosed in connection with preferred embodiments shown and described in detail, various modifications and improvements thereon will become apparent to those skilled in the art. Accordingly, the foregoing examples should not limit the spirit and scope of the present invention; rather it should be understood in the broadest sense allowable by law.

What is claimed is:

1. A processor-implemented method for testing comprising:

accessing a testing environment, wherein the testing environment includes an instruction RAM, an instruction fetch and decode unit (FAD), a code exerciser, a command interface, and a trace RAM, wherein a device under test (DUT) is accessible by the command interface, and wherein the testing environment includes a test instruction set architecture (TISA), wherein the TISA includes a plurality of opcodes, wherein the plurality of opcodes configure the testing environment;

programming a test sequence, by a user, wherein the test sequence includes one or more instructions from within the TISA;

storing, in the instruction RAM, the test sequence that was programmed;

fetching, by the FAD, a first instruction from the test sequence that was stored in the instruction RAM, wherein the fetching includes decoding the first instruction;

translating, by the code exerciser, the first instruction, wherein the translating produces a first packetized communication, wherein the DUT is responsive to the first packetized communication;

sending the first packetized communication, by the command interface, to the DUT;

receiving a first packetized response, by the command interface, from the DUT, wherein the first packetized response is stored in a trace RAM; and reporting, to the user, the first packetized response that was stored in the trace RAM.

2. The method of claim 1 further comprising initializing the testing environment, wherein the initializing includes control instructions in the TISA.

3. The method of claim 1 wherein the TISA includes a first grouping of opcodes, wherein the first grouping of opcodes controls the testing environment.

4. The method of claim 3 wherein the TISA includes a second grouping of opcodes, wherein the second grouping of opcodes exercises the DUT.

5. The method of claim 1 further comprising adding, to the TISA, one or more new instructions, wherein the one or more new instructions exercise a second DUT.

6. The method of claim 1 wherein the TISA comprises one or more data words.

7. The method of claim 6 wherein a first data word within the one or more data words comprises 32 bits.

8. The method of claim 7 wherein the first data word includes an opcode field, wherein the opcode field comprises 5 bits.

9. The method of claim 8 wherein the first data word includes a first argument field, wherein the first argument field comprises 4 bits.

10. The method of claim 9 wherein the first data word includes a second argument field, and wherein the second argument field comprises 10 bits.

11. The method of claim 10 wherein the first data word includes a third argument field, and wherein the third argument field comprises 4 bits.

12. The method of claim 11 wherein the first data word includes a fourth argument field, and wherein the third argument field comprises 9 bits.

13. The method of claim 6 wherein a second data word comprises 32 bits, and wherein the second data word includes a first data pattern or a start address.

14. The method of claim 6 wherein a third data word comprises 32 bits, and wherein the third data word includes a second data pattern.

15. The method of claim 1 wherein the receiving includes a second packetized response.

16. The method of claim 1 wherein the fetching and translating include a second instruction.

17. The method of claim 16 wherein the sending includes a second packetized communication.

18. The method of claim 1 wherein the DUT comprises a PCIExpress (PCIe) controller.

19. The method of claim 18 wherein the sending comprises simulated traffic from a PCIe root complex.

20. The method of claim 18 wherein the sending comprises simulated traffic from a PCIe endpoint.

21. The method of claim 1 wherein the DUT comprises a compute express link (CXL) controller.

22. The method of claim 1 wherein the DUT comprises an ethernet controller.

23. The method of claim 1 wherein the TISA includes a plurality of opcodes.

24. The method of claim 23 further comprising launching, by one or more opcodes within the plurality of opcodes, a compliance test on the DUT, by the testing environment.

25. The method of claim 24 wherein the compliance test includes a PCIe compliance test suite (CTS).

26. A computer program product embodied in a non-transitory computer readable medium for instruction execution, the computer program product comprising code which causes one or more processors to perform operations of:

accessing a testing environment, wherein the testing environment includes an instruction RAM, an instruction fetch and decode unit (FAD), a code exerciser, a command interface, and a trace RAM, wherein a device under test (DUT) is accessible by the command interface, and wherein the testing environment includes a test instruction set architecture (TISA), wherein the TISA includes a plurality of opcodes, wherein the plurality of opcodes configure the testing environment;

programming a test sequence, by a user, wherein the test sequence includes one or more instructions from within the TISA;

storing, in the instruction RAM, the test sequence that was programmed;

fetching, by the FAD, a first instruction from the test sequence that was stored in the instruction RAM, wherein the fetching includes decoding the first instruction;

translating, by the code exerciser, the first instruction, wherein the translating produces a first packetized communication, wherein the DUT is responsive to the first packetized communication;

sending the first packetized communication, by the command interface, to the DUT;

receiving a first packetized response, by the command interface, from the DUT, wherein the first packetized response is stored in a trace RAM; and reporting, to the user, the first packetized response that was stored in the trace RAM.

27. A computer system for instruction execution comprising:

a memory which stores instructions;

one or more processors coupled to the memory wherein the one or more processors, when executing the instructions which are stored, are configured to:

access a testing environment, wherein the testing environment includes an instruction RAM, an instruction fetch and decode unit (FAD), a code exerciser, a command interface, and a trace RAM, wherein a device under test (DUT) is accessible by the command interface, and wherein the testing environment includes a test instruction set architecture (TISA), wherein the TISA includes a plurality of opcodes, wherein the plurality of opcodes configure the testing environment;

program a test sequence, by a user, wherein the test sequence includes one or more instructions from within the TISA;

store, in the instruction RAM, the test sequence that was programmed;

fetch, by the FAD, a first instruction from the test sequence that was stored in the instruction RAM, wherein the fetching includes decoding the first instruction;

translate, by the code exerciser, the first instruction, wherein the translating produces a first packetized communication, wherein the DUT is responsive to the first packetized communication;

send the first packetized communication, by the command interface, to the DUT;

receive a first packetized response, by the command interface, from the DUT, wherein the first packetized response is stored in a trace RAM; and report, to the user, the first packetized response that was stored in the trace RAM.

* * * * *